United States Patent
Thompson et al.

(10) Patent No.: US 10,559,476 B2
(45) Date of Patent: Feb. 11, 2020

(54) METHOD AND STRUCTURE FOR A 3D WIRE BLOCK

(71) Applicant: R&D Circuits, Inc., South Plainfield, NJ (US)

(72) Inventors: Donald Thompson, Freemont, CA (US); Cosimo Cantatore, Gilroy, CA (US)

(73) Assignee: R&D Circuits, Inc.

( * ) Notice: Subject to any disclaimer, the term of this patent is extended or adjusted under 35 U.S.C. 154(b) by 0 days.

(21) Appl. No.: 15/688,238

(22) Filed: Aug. 28, 2017

(65) Prior Publication Data

US 2018/0068867 A1    Mar. 8, 2018

Related U.S. Application Data

(60) Provisional application No. 62/383,182, filed on Sep. 2, 2016.

(51) Int. Cl.
| | |
|---|---|
| *H01L 21/48* | (2006.01) |
| *H01R 12/52* | (2011.01) |
| *H01R 12/70* | (2011.01) |
| *H01R 13/11* | (2006.01) |
| *H01R 13/24* | (2006.01) |

(52) U.S. Cl.
CPC ........... *H01L 21/486* (2013.01); *H01R 12/52* (2013.01); *H01R 12/7082* (2013.01); *H01R 13/112* (2013.01); *H01R 13/2414* (2013.01)

(58) Field of Classification Search
CPC .. H05K 3/4069; H05K 7/1061; H01L 21/486; H01L 23/49827; G01R 1/04; H01R 12/52; H01R 12/7082; H01R 13/112
See application file for complete search history.

(56) References Cited

U.S. PATENT DOCUMENTS

| | | | |
|---|---|---|---|
| 9,875,958 B1* | 1/2018 | Buvid | H01L 23/49838 |
| 9,935,035 B1* | 4/2018 | Buvid | H01L 23/473 |
| 2013/0242493 A1* | 9/2013 | Shenoy | H01L 23/49827 361/679.21 |
| 2015/0201500 A1* | 7/2015 | Shinar | H05K 3/125 425/132 |
| 2017/0161422 A1* | 6/2017 | Allen | G06F 17/5077 |

* cited by examiner

*Primary Examiner* — Bilkis Jahan
*Assistant Examiner* — Victor V Barzykin
(74) *Attorney, Agent, or Firm* — Richard B. Klar, Esq.; Law Office Richard B. Klar

(57) ABSTRACT

The present invention provides for a structure and a mechanism by which by utilizing additive manufacturing processes electrical connections are created that connect the top and bottom of a block in a customizable pattern. Specifically connection points can be created on the surface of the block and route them to alternate locations transforming the original pattern to a smaller, larger, or alternate pattern.

28 Claims, 4 Drawing Sheets

METHOD AND STRUCTURE FOR A 3D WIRE BLOCK

RELATED APPLICATIONS

The present application references and incorporates the entire subject matter prior application of Trace Anywhere Interconnect Ser. No. 15/189,435 filed on Jun. 22, 2016 by applicant as if incorporated herein.

BACKGROUND

1. Field of the Invention

The present invention relates generally to the electrical test and measurement and specifically it relates to a new way of creating electrically conductive paths in a block. In particular the present invention relates to forming an electrical interconnect mechanism between two or more discrete contact points such as but not limited to circuit pads within two or more parallel circuit planes with circuitry formed in three-dimensional space between the aforementioned two or more circuit planes in order to allow for electrical coupling of two or more electrical devises through said interconnect device. This new mechanism of the present invention decreases design time and increases conductive path routing options when compared to current industry mechanisms.

2. The Related Art

Conventional interconnect technology limits the routing of circuitry to the x-y plane by way of conductive traces. These traces are then connected in the z-axis through holes (vias) formed perpendicular to the traces, aligned over the traces. These vias are then coated or plated with a metallization either partially or completely filled, connecting the traces to circuitry formed in the x-y planes above and below.

It is normal for these interconnect structures to have an array of contact pads on either side of the outer major surfaces of the structure and occasionally even on the minor sides or surfaces of the structure. These contact pads are meant to be electrically coupled with electronic components on the outer surfaces. When there are a large number of contact pads of points on each side to be electrically coupled the internal circuitry layers become very dense and require a large number of routing layers. Each of these layers are traditionally formed in layer pairs of two, sandwiched on both sides of a dielectric sheet. These sheets are manufactured concurrently then bonded together with additional dielectric sheet layers forming multilayered structures. Vias are then formed and moralized through or partially through these layer stacks making the required z aids interconnects. Partial or buried vias can be formed end metalized on each of the layer pairs prior to bonding the layers together.

Alternatively, to improve routing density dielectric layers and circuitry layers can be built up one on top of another sequentially with blind vias formed only where necessary. This eliminates the need of through vias, which take up routing space in the x-y planes on layers where the vias is not essential. This via anywhere approach greatly improved routing density but suffers from the cost of time and labor to build these layers sequentially.

SUMMARY

The present invention provides a mechanism and a structure in which an electrical interconnect mechanism is formed having complex connections between two or more discrete contact points such as but not limited to circuit pads within two or more parallel circuit planes with circuitry formed in three-dimensional space between the aforementioned two or more circuit planes, in this way the present invention provides for electrical coupling of two or more electrical devices through said interconnect device.

The present invention provides for a structure and a mechanism by which by utilizing additive manufacturing processes electrical connections are created that connect the top and bottom of a block in a customizable pattern. Specifically connection points can be created on the surface of the block and routed to alternate locations transforming the original pattern to a smaller, larger, or alternate pattern.

DETAILED DESCRIPTION OF THE PREFERRED EMBODIMENTS

The present application references and incorporates the entire subject matter prior application of Trace Anywhere Interconnect Ser. No. 15/189,435 filed on Jun. 22, 2016 by applicant as if incorporated herein. The difference between the prior application and the current one is that metallization is provided first before the dielectric material, such as but not limited to plastic, is added in the current present application. The exact opposite is the case in the prior Trace Anywhere Interconnect application.

Figure 2:
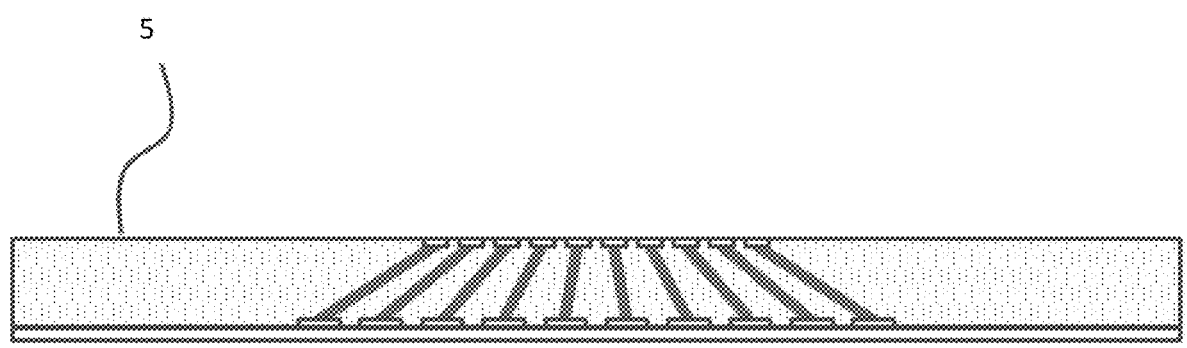
FIG. 2 is a sectional side view of the additive metal construction of the present invention after dielectric fill.
Figure 3:
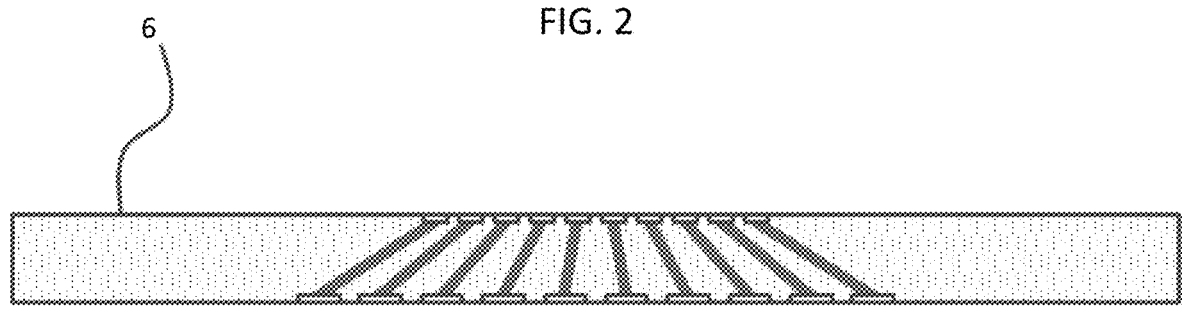
FIG. 3 is a sectional side view of the metal and dielectric of the present invention after bottom plate is removed.
Figure 4:
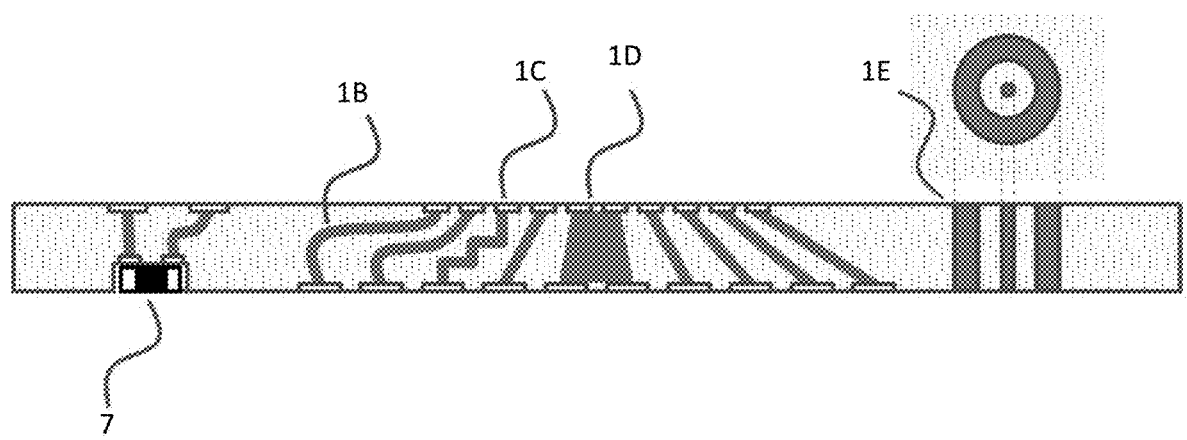
FIG. 4 is a side view of an embodiment of the present invention in which unique construction options are used in accordance with the mechanism of the present invention.
Figure 5:
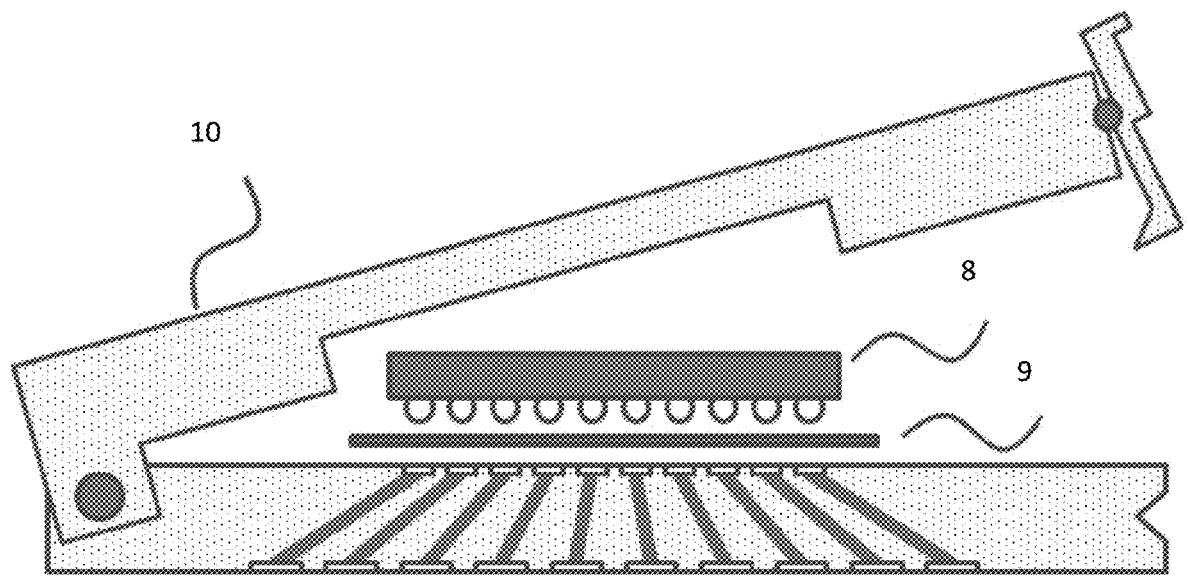
FIG. 5 is a sectional view of one embodiment for the present invention showing reinforcing mechanics.
Figure 6:
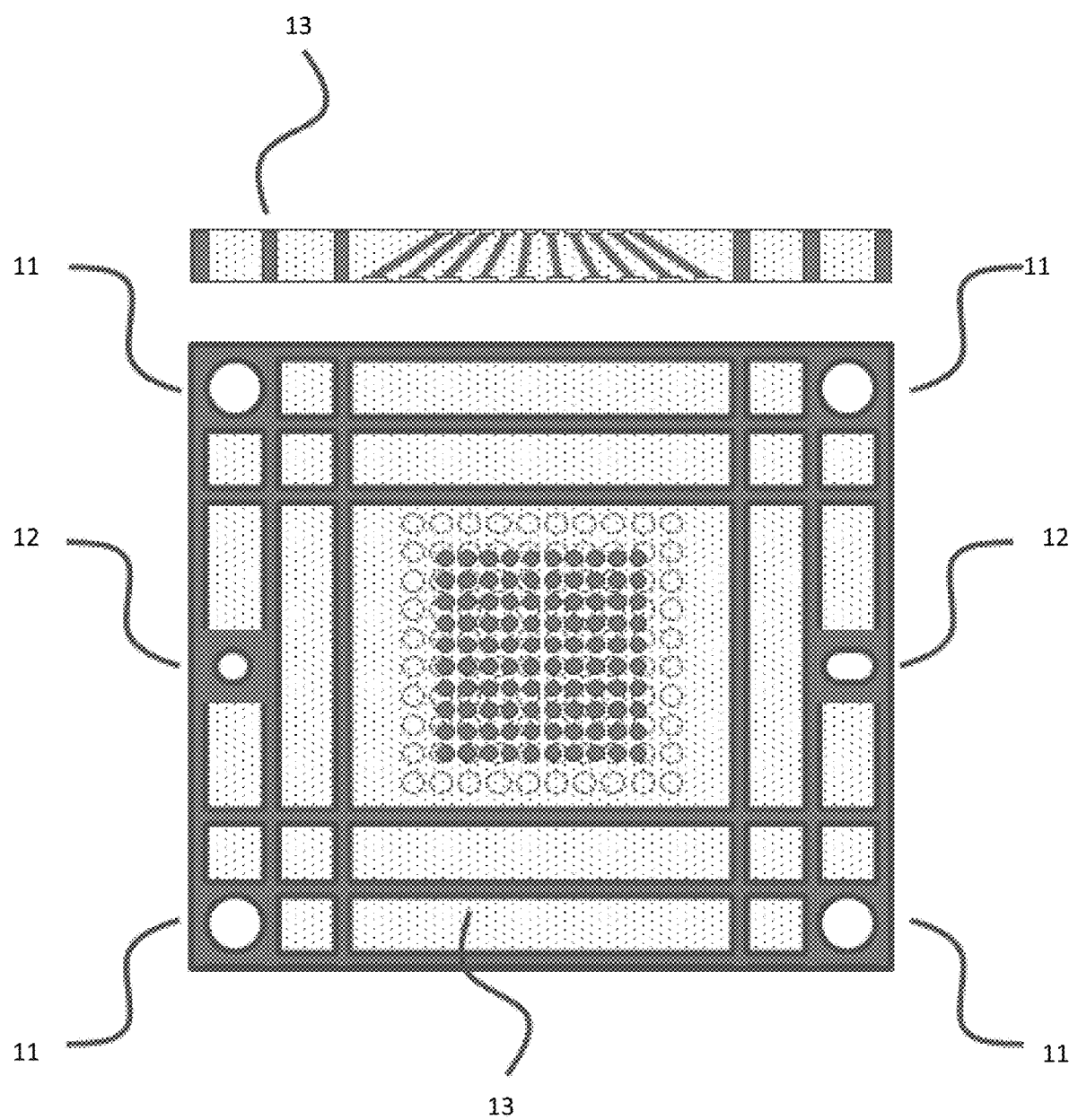
FIG. 6 is a sectional view of another embodiment of the present invention.
Figure 7:
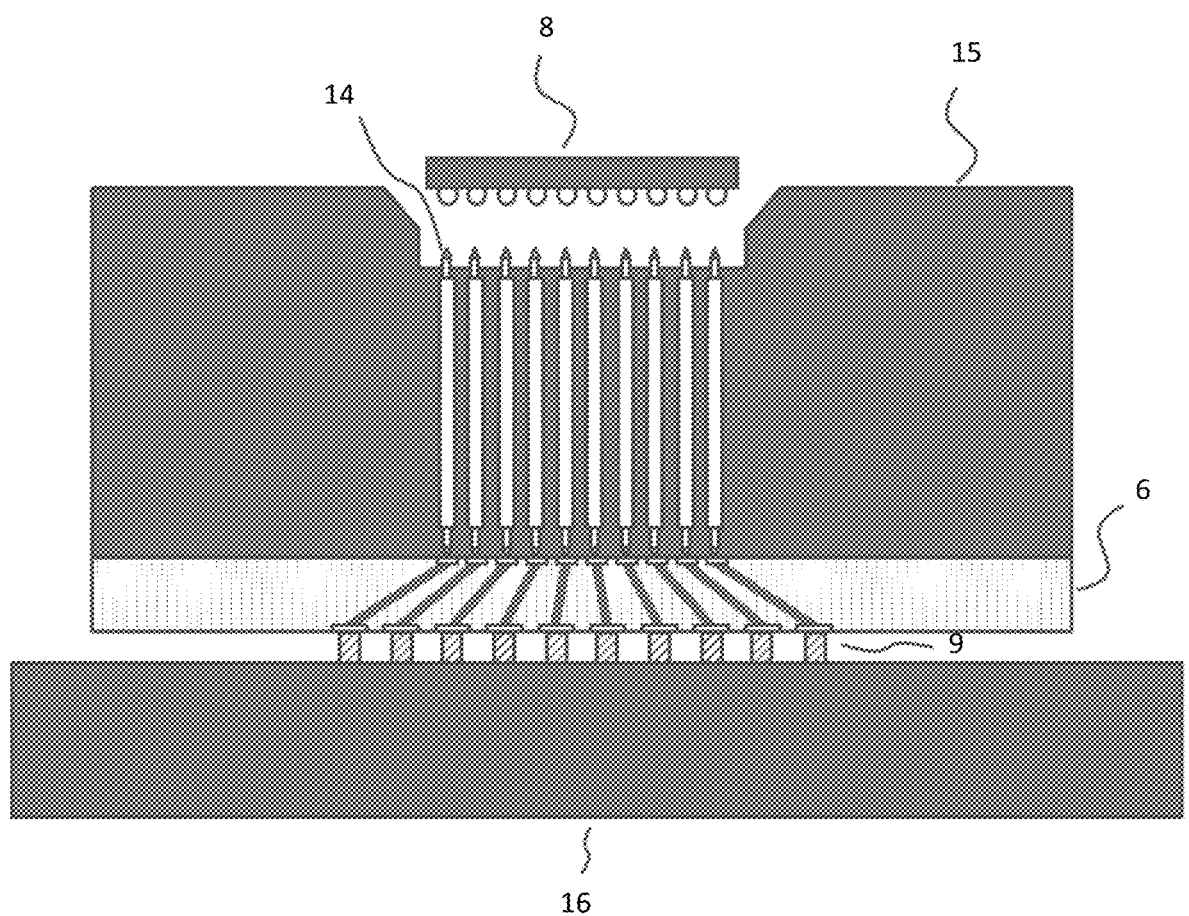
FIG. 7 shows another embodiment for the present invention in which the structure of the present invention is connected for a test and measurement application.

Referring now to the drawing of FIGS. 1-7, FIGS. 1-3 show the basic construction steps for the structure and mechanism of the present invention. FIG. 4 allows some alternate and advantageous wiring capabilities using this mechanism. FIGS. 5 and 6 show two embodiments of the present invention. FIG. 7 shows another embodiment in which the structure of the present invention is connected for a test and measurement application.

Figure 1:
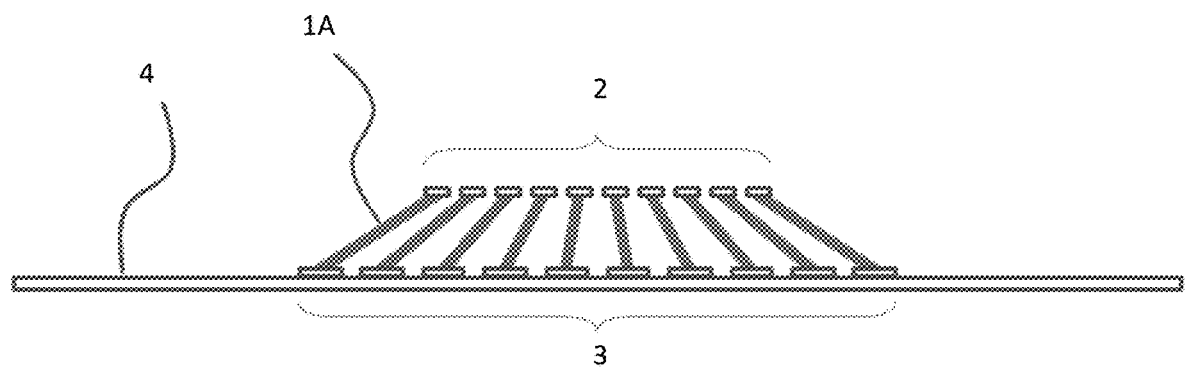
FIG. 1 is a sectional side view of the additive metal construction of the present invention before dielectric fill.

FIGS. 1-3 describe the basic construction technique in detail of the present invention. First, metal, formed by a 3D printer or commercially available and known processes (e.g. material jetting, binder jetting, material extrusion, powder bed fusion, directed energy deposition, or sheet lamination), is deposited and formed to a desired shape through an additive process (FIG. 1) (1,2,3,4). A dielectric (5), typically an epoxy material, is added to fill in the gaps in the metal (FIG. 2). Air can also be added to the model, by not allowing the mold to fill certain areas. Once the dielectric material is filled in, the holding frame (4) will be removed by a secondary process, e.g. grinding, etching, laser cutting, or milling. The finished block (6) now has separate isolated paths that will provide electrical connection to different spots on the block.

Additive manufacturing provides many advantageous options not normally available in printed wiring boards (PCB). The electrically conductive path will be referred to as a "wire" herein even though some example will not directly resemble a traditional wire.

The first wiring option is a simple straight wire that can be at any angle (1A). This is a simple point to point connection. The second option is to put curves in the wire (1B) to aid in routing the wires within the block. The third option is to make multiple stair-step elevation changes (1C) in the wire to route within the block. A fourth option is to merge separate wires into joined much larger wires to reduce resistivity, modify inductance, modify capacitance, or simplify construction. A fifth option is to create coaxial transmission line structures (1B), waveguide, or other impedance controlled structures.

Additional mechanical structures for providing support can be added to the printed 3D wire block of the present invention. For example holes for a lid (10) and features for latching mechanism can be built in to the design. This reduces the number of steps in the construction process compared to traditional mechanisms.

FIG. 5 illustrates an embodiment of the present invention of a socket using this process to scale in a larger pitch pad pattern into a finer package size. By adding an interconnect material (9) (e.g. sheet of conductive elastomeric columns, spring pins, or other compliance interconnect device), an integrated circuits chip (8) can be socketed to a board or other interconnect device.

In the embodiment of FIG. 6, an internal frame work (13) is shown within the plastic adding mechanical support structure. This internal frame 13 provides several benefits for the present invention. This will allow for alignment features (12) that are tied directly to the tolerance accuracy of the wires within the block. This will allow for mechanical connection features such as screw holes (11) or clips. This will increase the strength of the over all block, improving over the strength of the solid dielectric. This will also allow for modifying the temperature expansion properties of the block.

FIG. 7 illustrates an application of the present invention of test measurement purposes. The application in FIG. 7 is for a test and measurement application where a socket (15) must be placed on a Printed Wire Board (16) (PWB or PCB) to electrically connect it to automated test equipment, such as an Advantest 93k or Teradyne UltraFlex tester.

The 3D wire block (6) can transform the electrical pad pattern on the PCB (16) into a smaller pattern the matches the device under test Device Under Test (DUT) (8) pin out pattern.

In this application of FIG. 7 an elastomeric column (9) connects the 3D wire block (6) to the socket (15). The socket holds spring pins (14) which provide compliance to electrically connect toe DUT (8) to the 3D wire block (6).

The 3D wire block of the present invention in this instance allows the PCB (16) to be manufactured more quickly and easily since it is at a larger via pitch when compared to the DUT (8) pitch.

In addition the various embodiment structures of the Trace Anywhere Interconnect application can be and are incorporated herein with the mechanism and structure of the present invention.

While presently preferred embodiments have been described for purposes of the disclosure, numerous changes in the arrangement of mechanism steps and those skilled in the art can make apparatus parts. Such changes are encompassed within the spirit of the invention as defined by the appended claims.

What is claimed is:

1. A method for forming an electrical interconnect mechanism, the steps comprising:
   depositing metal to form a plane having a programmed shape through a process that adds material rather than removes it to form a metal plane by a 3D forming;
   extending wires of programmed geometries from said formed metal plane and extending said wires to programmed locations in three dimensional space, and
   adding a dielectric to fill on top of said metal plane encompassing all of said metal wires and curing said dielectric to form one or more substrates, removing said metal plane from said one or more substrates by a secondary process thereby producing a finished block having separate isolated paths that provides one or more electrical connections to different spots on said one or more substrates.

2. The method according to claim 1 wherein said process that adds material rather than removes it for forming said metal plane is by laser sintering.

3. The method according to claim 1 wherein said dielectric is an epoxy material added to fill in the gaps in said metal.

4. The method according to claim 3 wherein said dielectric can include air gaps added to said substrates by not allowing said dielectric to fill certain areas.

5. The method according to claim 1 where once the dielectric material is filled in and said metal plane is removed by a secondary process of one of grinding, etching, laser cutting, or milling.

6. The method according to claim 1 further comprising the steps of providing a simple straight wire that can be arranged at any angle for a point to point connection.

7. The method according to claim 1 further comprising shaping a wire with curves to aid in routing the wires within the block.

8. The method according to claim 1 further comprising making multiple stair-step elevation changes in the wire to route within the block.

9. The method according to claim 1 further comprising merging separate wires into joined larger wires to reduce resistivity, modify inductance, modify capacitance, or simplify construction.

10. The method according to claim 1 further comprising providing coaxial transmission line structures waveguide, or other impedance controlled structures.

11. The method according to claim 1 further comprising providing additional mechanical structures for providing support can be built into said electrical interconnect mechanism by providing holes for a lid of said structure and a latching mechanism for said lid thereby reducing steps in construction of said structure compared with traditional processes.

12. The method according to claim 1 further comprising using a socket to scale in a larger pitch pad pattern into a finer package size wherein by adding an interconnect material an integrated circuits chip can be socketed to a board or other interconnect device.

13. The method according to claim 12 wherein said interconnect material can be either a sheet of conductive elastomeric columns, spring pins, or other compliance interconnect device.

14. The method according to claim 1 wherein said structure has an internal frame having an alignment within a tolerance accuracy to the wires within the block so that mechanical connection features such as screw holes or clips increases strength of the overall block, improving the strength of the solid dielectric and permitting modification of the temperature expansion properties of the block.

15. The method according to claim 1 wherein an elastomeric column connects the 3D wire block to a PCB and the socket holds spring pins which provide compliance to electrically connect the DUT (8) to the wire block thereby permitting the Printed Circuit Board (PCB) to be manufactured at a larger via pitch when compared to the Device Under Test (DUT) pitch so that it provides a quick and easy manufacturing of said Printed Circuit Board (PCB).

16. A method for forming an electrical interconnect mechanism, the steps comprising:
  depositing metal to form a plane; programmed shape through a process that adds material rather than removes it to form a metal plane by a 3 D forming;
  extending wires of programmed geometries from said formed metal plane and extending said wires to programmed locations in three dimensional space, and
  adding a dielectric; to fill on top of said metal plane encompassing all of said metal wires and curing said dielectric to form one or more substrates, removing said metal plane from said one or more substrates by a secondary process thereby producing a finished block having separate isolated paths that provides one or more electrical connections to different spots on said one or more substrates.

17. The method according to claim 16 wherein said metal plane is formed by said 3 D formatting by one of either a 3 D printer, material jetting, binder jetting, material extrusion, powder bed fusion, directed energy deposition, or sheet lamination.

18. An electrical interconnect apparatus formed by the process comprising the steps of:
  depositing metal to form a plane, programmed shape through a process that adds material rather than removes it to form a metal plane by a 3 D forming;
  extending wires of programmed geometries from said formed metal plane and extending said wires to programmed locations in three dimensional space, and
  adding a dielectric, to fill on top of said metal plane encompassing all of said metal wires and curing said dielectric to form one or more substrates, removing said metal plane from said one or more substrates by a secondary process thereby producing a finished block having separate isolated paths that provides one or more electrical connections to different spots on said one or more substrates.

19. The apparatus according to claim 18 further comprising:
  said extended wires are simple straight wires that can be arranged at any angle for a point to point connection.

20. The apparatus according to claim 18 wherein said extended wires are shaped with curves to aid in routing the wires within the block.

21. The apparatus according to claim 18 wherein said wires are shaped with multiple stair-step elevation patterns as said wires are routed within the block.

22. The apparatus according to claim 18 further comprising said wires include separate wires merged into joined larger wires to reduce resistivity, modify inductance, modify capacitance, or simplify construction.

23. The apparatus according to claim 18 further comprising coaxial transmission line structures waveguide, or other impedance controlled structures.

24. The apparatus according to claim 18 further comprising additional mechanical structures that support and are built into said electrical interconnect apparatus including a structure having a lid having a hole and a latching mechanism for said lid thereby reducing steps in construction of said structure compared with traditional processes.

25. The apparatus according to claim 18 further comprising a socket, said socket scaling a larger pitch pad pattern into a finer package size thereby permitting an integrated circuits chip to be socketed to a board or other interconnect device by adding an interconnect material.

26. The apparatus according to claim 25 wherein said interconnect material can be either a sheet of conductive elastomeric columns, spring pins, or other compliance interconnect device.

27. The apparatus according to claim 18 wherein said structure has an internal frame having an alignment within a tolerance accuracy to said wires within said block so that mechanical connection features including screw holes or clips increase strength of said block, improving the strength of the solid dielectric and permitting modification of the temperature expansion properties of the block.

28. The apparatus according to claim 18 further comprising:
  an elastomeric column connected between said block and a PCB, and
  said socket includes spring pins, held therein, that provide compliance for an electrically connection from said DUT to said block thereby permitting the Printed Circuit Board (PCB) to be manufactured at a larger via pitch when compared to the Device Under Test (DUT) pitch so that it provides a quick and easy manufacturing of said the Printed Circuit Board (PCB).

* * * * *